United States Patent [19]

Schulz, Jr. et al.

[11] Patent Number: 4,808,932
[45] Date of Patent: Feb. 28, 1989

[54] ROTOR FAULT AND LOCATION DETECTOR FOR INDUCTION MOTORS

[75] Inventors: Max W. Schulz, Jr., Scotia; Stephen E. Grabkowski; Gerald B. Kliman, both of Schenectady, all of N.Y.

[73] Assignee: Electric Power Research Institute, Inc., Palo Alto, Calif.

[21] Appl. No.: 50,992

[22] Filed: May 15, 1987

[51] Int. Cl.$^4$ .............................................. G01R 31/02
[52] U.S. Cl. ............................ 324/545; 324/158 MG
[58] Field of Search ............... 324/158 MG, 545, 511; 318/490; 340/648, 680; 73/660

[56] References Cited

U.S. PATENT DOCUMENTS

| 2,999,981 | 9/1961 | Probert | 324/545 |
| 3,875,511 | 4/1975 | Sims | 324/158 MG |
| 4,053,830 | 10/1977 | Porter | 324/158 MG |
| 4,091,662 | 5/1978 | Emanuel | 324/158 MG |
| 4,136,312 | 1/1979 | Salon et al. | 324/158 MG |
| 4,164,705 | 8/1979 | Whitney et al. | 324/158 D |
| 4,194,129 | 3/1980 | Dumbeck | 324/161 |
| 4,196,475 | 4/1980 | Hall | 324/57 R |
| 4,203,061 | 5/1980 | Minakuchi | 318/490 |
| 4,229,694 | 10/1980 | Wilson et al. | 324/158 MG |
| 4,377,784 | 3/1983 | Saito et al. | 324/158 MG |
| 4,429,578 | 2/1984 | Darrel et al. | 340/680 |

FOREIGN PATENT DOCUMENTS 202857 12/1982 Japan .
8501581 4/1985 PCT Int'l Appl. ............. 318/490
2044940 10/1980 United Kingdom .

Primary Examiner—Gerard R. Strecker
Assistant Examiner—Anthony L. Miele
Attorney, Agent, or Firm—Flehr, Hohbach, Test, Albritton & Herbert

[57] ABSTRACT

A method and apparatus for detecting rotor faults in an induction motor. Such induction motors have a stator and a rotor comprising a multiplicity of rotor bars. The flux around the rotor bars is detecte at a predefined flux detection point in the motor, generally by using a coil wound around one of the stator teeth. A synchronization signal is generated once per revolution of the rotor when a predefined position on the rotor is closest to a stator reference point, usually the flux detection point. The detected flux signal is filtered to reject signals in a predefined frequency band around the frequency at which the rotor bars pass the flux detection point, and then it is synchronously time averaged. Averaging requires that corresponding portions of the flux signal, for a series of rotor revolutions, be added, and the synchronization signal is used as a reference for matching corresponding portions of the flux signal. Statistically significant peaks in the resulting time averaged signal indicate the presence of a rotor bar fault, and the location of such peaks corresponds to the location of rotor bar faults with respect to the predefined position on the rotor.

23 Claims, 5 Drawing Sheets

ROTOR FAULT AND LOCATION DETECTOR FOR INDUCTION MOTORS

The present invention relates generally to induction motors, and particularly to a system and method for detecting the presence and location of rotor bar faults in induction motors.

BACKGROUND OF THE INVENTION

The present invention monitors an induction motor while it is operational, and detects and locates rotor bar faults in real time without interfering with the operation of the motor.

The prior art includes numerous methods of detecting "cage faults". Most require one or more of the following actions: disassembly of the motor, motor shut down, and/or special connection of instrumentation inside the motor. For instance, the growler method uses an electromagnet coupled to the rotor surface which emits a loud noise when it spans an open rotor bar. This requires disassembly of the motor.

Single phase testing requires disconnecting one phase of the motor's power supply, and monitoring the current drawn while exciting the remaining terminals at low voltage and rotating the rotor slowly, by hand. If there is a broken bar the current drawn will vary with rotor position. While sensitivity is good—a broken bar is usually clearly evidenced by a current variation of over five percent—the motor must be taken out of service and one phase disconnected. Further, the low voltage power requirement is considered to be a safety hazard by many utility companies.

Unlike prior art systems, the present invention unambiguously detects rotor faults while the motor is running. Furthermore, it identifies the location of the rotor bar with the fault. The ability to locate the bar or bars at fault is of value because it facilitates fault identification and repair.

As will be described in more detail below, the present invention works by using a coil on a stator tooth, inside the motor, to measure the flux around (actually, in the air gap above) each rotor bar while the motor is running. By synchronizing the measurement process with rotation of the rotor, the flux measurements for each rotor bar can be separately identified. The underlying theory of operation is that the measured flux will be markedly different for normal rotor bars and for rotor bars with faults.

The main disadvantage of the present invention is that it requires the installation of a coil on a stator tooth inside the motor. Clearly, for new or rewound motors this is not a problem, because the coil can be installed when the motor is being assembled. For motors which have already been assembled, and for those already in operation, the disassembly required for installing a stator tooth coil obviously requires an interruption in service. On the other hand, only one interruption is required in the life of the motor because the fault monitoring process itself is performed during normal motor operation.

It is therefore a primary object of the present invention to provide a system and method for detecting and identifying the location of rotor bar faults in induction motors.

SUMMARY OF THE INVENTION

In summary, the present invention is a method and apparatus for detecting rotor faults in an induction motor. Such induction motors have a stator and a rotor comprising a multiplicity of rotor bars. The flux around (actually, in the air gap above) the rotor bars is detected at a predefined flux detection point in the motor, generally by using a coil wound around one of the stator teeth. A synchronization signal is generated once per revolution of the rotor when a predefined position on the rotor is at a selected reference position on the stator, usually a point closest to the flux detection point.

The detected flux signal is filtered to reject signals in a predefined frequency band related to the frequency at which the rotor bars pass the flux detection point, and then it is synchronously time averaged. Averaging requires that corresponding portions of the flux signal, for a series of rotor revolutions, be added, and the synchronization signal is used as a reference for matching corresponding portions of the flux signal. Statistically significant peaks in the resulting time averaged signal indicate the presence of a rotor bar fault, and the location of such peaks corresponds to the location of rotor bar faults with respect to the predefined position on the rotor.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
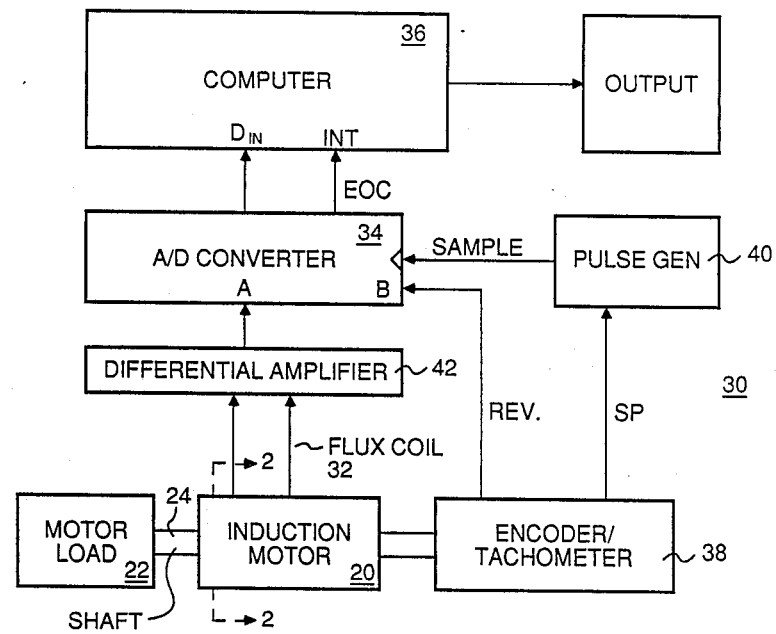
FIG. 1 is a block diagram of a rotor bar fault detector in accordance with the present invention.
Figure 3:
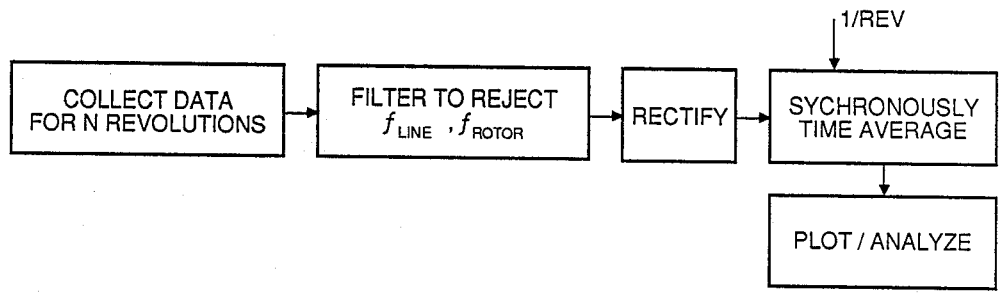
FIG. 3 is a flow chart of the method of the invention.

Referring to FIG. 1, an induction motor 20 is monitored by a rotor fault detection system 30 while driving its usual motor load 22 via the motor shaft 24.

Figure 2:
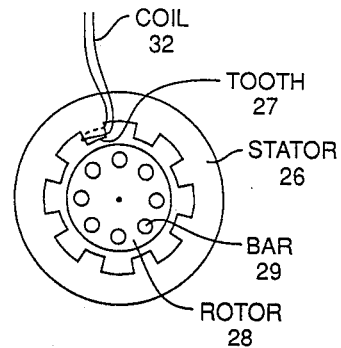
FIG. 2 is a section view of an induction motor, showing the addition of a flux detection coil.

As shown in FIG. 2, which is a section view corresponding to line 2—2 in FIG. 1, the motor has a stator 26 and a rotor 28. The stator 26 has numerous stator teeth (which are generally parallel to the axis of the motor's shaft 24), including one stator tooth 27 which has been wrapped with a flux detection coil 32. The coil 32 is made up of several turns of fine wire (e.g., #33 wire). The motor also has a rotor 28 which includes numerous rotor bars 29 running generally parallel to axis of the motor's shaft.

For those not skilled in the art of induction motor design, several items of basic information regarding induction motors are noted. First, the stator is wired to an a.c. power supply so that it generates a rotating magnetic field that causes the rotor to turn. Unlike some other types of motors, the speed of the motor—i.e., the rate at which the rotor turns—depends on the size of the load being driven by the motor. This rate is equal to the nominal motor speed (i.e., the rate at which the stator field rotates) minus a factor called the slip rate, which is typically a very small fraction of the nominal motor speed. The important fact for purposes of the present invention is that the exact rate of the rotor is not known unless it is measured.

Second, the stator's magnetic field induces current in the rotor bars 29. As the rotor spins, the current in the rotor bars generates magnetic fields which, in turn, induce a signal in the coil 32.

The purpose of the coil 32 is to measure the magnetic flux field associated with each rotor bar. The flux associated with open and high resistance rotor bars (which are open or partially open) will have a different pattern than the flux associated with normal rotor bars because the current flow through the broken rotor bar will be blocked, creating an imbalance between the stator's rotating field and rotor's field at the defective rotor bar or bars.

Referring to FIG. 1, the signal in the flux coil 32 is buffered by a differential amplifier 42 and digitally sampled using a twelve bit analog to digital converter (ADC) 34. The converter 34 includes a second circuit for sampling the REV signal—so that the flux data can be correlated with rotor position. Since the REV signal is either on or off, a simple comparator can be used to generate a binary 0 or 1 signal to indicate whether the REV signal is on or off.

The ADC 34 samples the flux signal each time a SAMPLE pulse is received, and then automatically begins conversion of the sample into a digital value. When it has completed conversion of the flux signal, the ADC 34 generates an "end of conversion" signal EOC. The EOC signal is used as a hardware interrupt signal by the computer 36, which responds by reading in the digital flux signal, and the binary REV signal. Both of these data items are stored serially in a buffer memory in the computer for analysis after the data is collected.

The signal in the flux coil 32 is digitally sampled at a frequency sufficient to separately measure the flux associated with each of the rotor bars 29 in the motor. Typically, the flux coil signal will be sampled at least four or five times during the time it takes one rotor bar to pass the coil 32. These measurements are taken for a period of time, such as ninety revolutions of the rotor, so that time averaged data can be used for detecting rotor faults.

The present invention locates the rotor bar or bars which have faults by synchronizing data collection with a predetermined reference location on the rotor 28. To do this, an encoder or tachometer 38 is coupled to the motor shaft. In one embodiment, the encoder 38 is a standard shaft encoder that produces two signals: (1) a REV signal which is a pulse that is generated at a predetermined rotor position; and (2) a second signal SP which comprises a specified number of pulses per revolution of the rotor. In this particular embodiment, the encoder generates 2500 pulses per revolution. Since we will typically need around 200 pulses per revolution to control the A/D converter, the SP signal is divided down by a divider circuit 40, which outputs a specified number of SAMPLE pulses per revolution.

In a second embodiment, the encoder 38 is a tachometer which generates only the REV signal. The pulse generator 40 in the second embodiment includes an oscillator, controlled by a phase locked loop, which generates a SAMPLE signal at a specified multiple of the frequency of the REV signal.

Example. The following describes the data collection technique used in a test of the invention. The motor was a 50 horse power motor with thirty-six rotor bars. Five data samples were taken for each rotor bar as it passed the flux detection coil 32. Furthermore, the motor was operating at a nominal speed of 1800 rpm (i.e., thirty revolutions per second) during the tests. Due to normal motor slip the actual motor speed was slightly less than 1800 rpm, but this differential can be ignored for most purposes of this analysis because of the way flux signal is sampled.

Thus, the number of data points collected per revolution of the rotor was samples per revolution = 5*36 = 180

The amount of data collected per second was:

samples per second = 30*180 = 5400 which is well within the rate that can be handled by ordinary A/D converters and desk top personal computers.

Actually, as noted above, two data items are sampled and stored with each SAMPLE pulse: the flux signal, and also the REV signal.

Using a memory buffer that could hold up to 16384 data samples, data was collected for ninety motor revolutions. When the data collection routine was started, the collected data was discarded until the first REV signal was received, so that the collected data would start at a known position on the rotor. Then ninety revolutions of data were collected.

Analysis of the collected data was performed as follows. First the data was filtered using a commercially available software signal processing program. Two filtering steps were performed: spectral components below 100 Hz were rejected by a high pass filtering step to eliminate the effects of the motor's sixty hertz power supply, and a spectral band (700 to 1400 Hz) associated with the rate at which rotor bars pass the flux detection coil (36 bars/rev*30 rev/sec = 1080 Hz) was removed by a band rejection filtering step.

Second, the data was rectified by taking the absolute value of every filtered data sample, to eliminate phase shift oscillation at the slip frequency. Third, the data was synchronously time averaged using the stored REV signal to indicate the beginning of each data subset (i.e., the data for each revolution of the rotor). See Appendix 1 for an example of an algorithm for synchronous time averaging. Fourth, the resulting data was plotted.

Figure 4A:
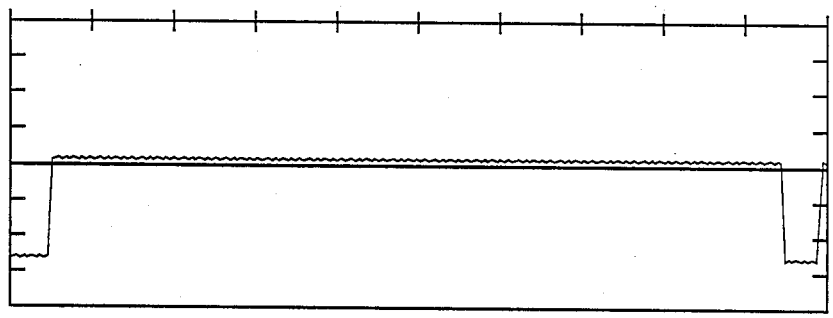
FIGS. 4a–4c show an analysis generated by the invention for a normal rotor.
Figure 4B:
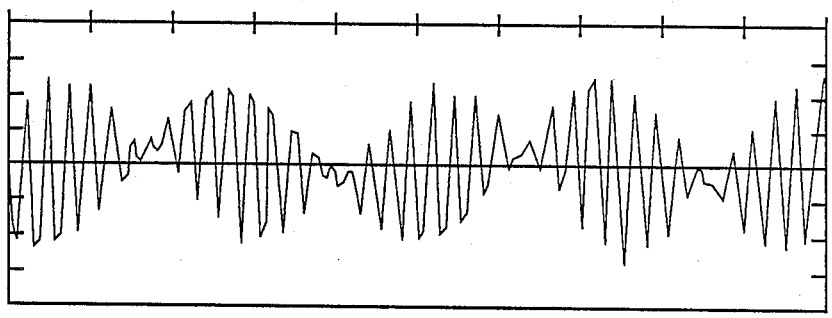
Figure 4C:
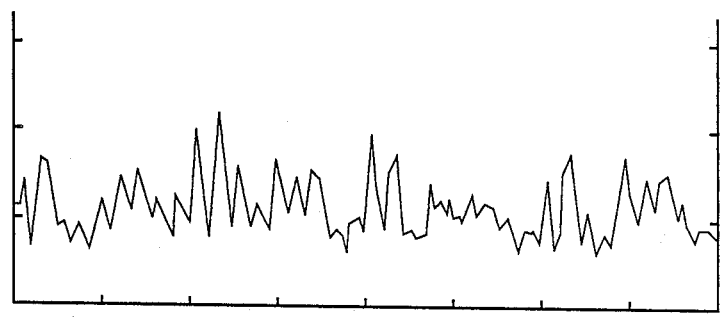

FIGS. 4a–4c show the REV signal, the raw flux data for approximately one revolution, and the time averaged data, respectively, for a motor with no known rotor faults. While there are many peaks and valleys in the averaged data, these are due to signal noise and normal variations in the resistivities of rotor bars.

Figure 5A:
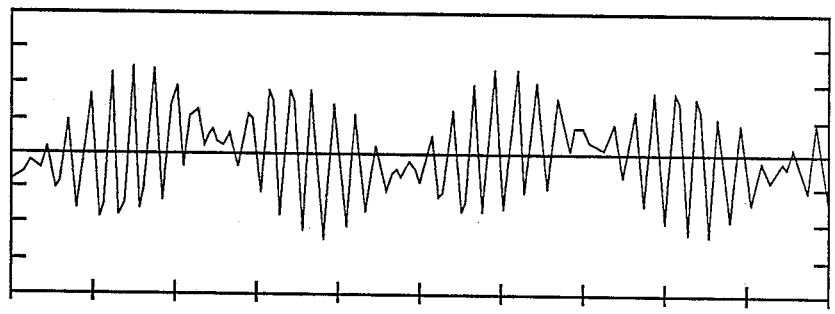
FIGS. 5a–5b show an analysis generated by the invention for an induction motor with one rotor bar that is partially open.
Figure 5B:
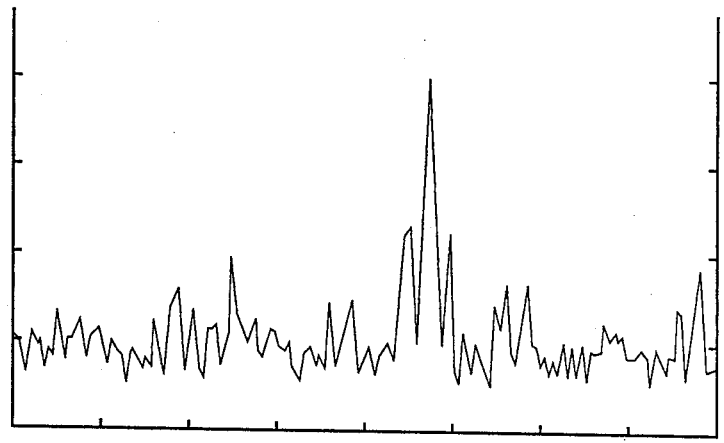

FIGS. 5a–5b show the raw flux data and the time averaged data, respectively, for a motor in which a hole was drilled radially in the end ring at one end of one rotor bar. This was done to demonstrate the sensitivity of the invention to partially open rotor bars. When installing the rotor in the motor, the encoder was coupled to the rotor so the partially open rotor bar would appear at approximately one half revolution in the synchronous averaging analysis. As can be seen in FIG. 5a, the effects of the partially open bar are very pronounced and appear in the predicted location. Tests of this rotor using the "growler" method failed to detect the partially open rotor bar.

Figure 6A:
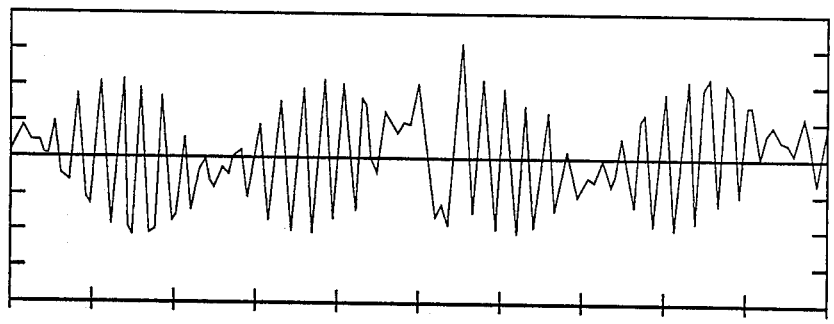
FIGS. 6a–6b show an analysis generated by the invention for an induction motor with one rotor that is fully open.
Figure 6B:
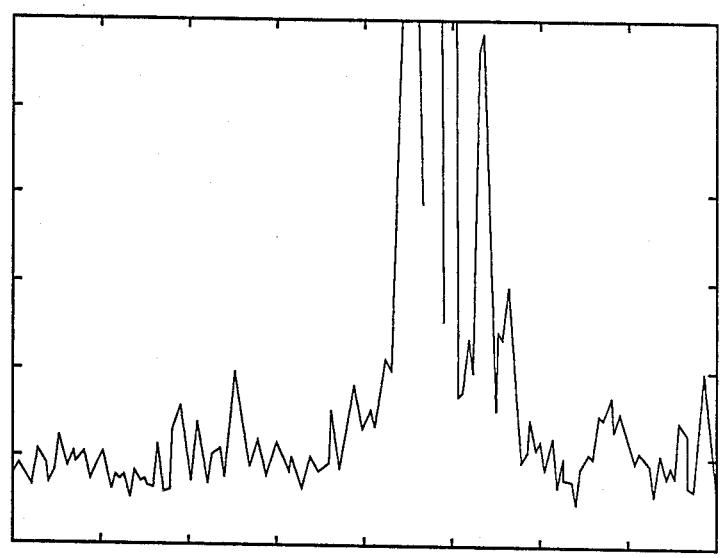
Figure 6C:
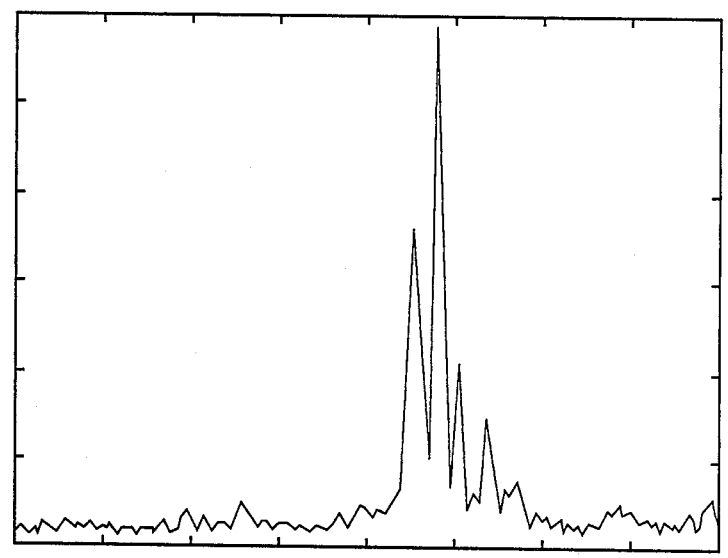

FIGS. 6a-6b show the raw flux data and the time averaged data, respectively, for a motor in which more holes were drilled in the same rotor bar, which was partially drilled as described above, to produce a truly open rotor bar. While the raw data in FIG. 6a does show a discontinuity, the time averaged data in FIG. 6b clearly shows the effect of the open rotor bar. FIG. 6c shows the same analysis results as FIG. 6b, using a scale compressed to show the peaks.

While the four step signal analysis procedure described above is preferred, some steps are more important than others. The rejection of the rotor bar frequency (1080 Hz in the example), and the synchronous time averaging are essential for reliable detection of open rotor bars. The rectification step is believed to be required for reliable detection of high resistance or partially open rotor bars. The rejection of the power supply frequency (60 Hz in the example) improves sensitivity, provides better signal to noise ratio, and decreases the false alarm rate.

ALTERNATE EMBODIMENTS

While the output in the preferred embodiment is a plot of the time averaged flux data, in other embodiments the computer could be programmed to automatically mathematically analyze the time averaged flux data and thereby detect the presence of peaks which indicate the presence of an open or high resistance rotor bar. Such automated detection could be performed using a fairly simple statistical analysis—such as detecting the presence of data more than three or four standard deviations above the mean data value. When the computer analysis detects a suspected fault, it could then perform any predefined task—such as ringing an alarm, and/or printing a plot such as the one shown in the Figures herein, or any other action designed to communicate the presence of a suspected fault. To help eliminate false alarms, the test could be repeated when a suspected fault is detected, and an alarm generated only if the analysis once again finds a suspected fault. An example of an automated fault detection method is shown in Appendix 2.

Figure 7:
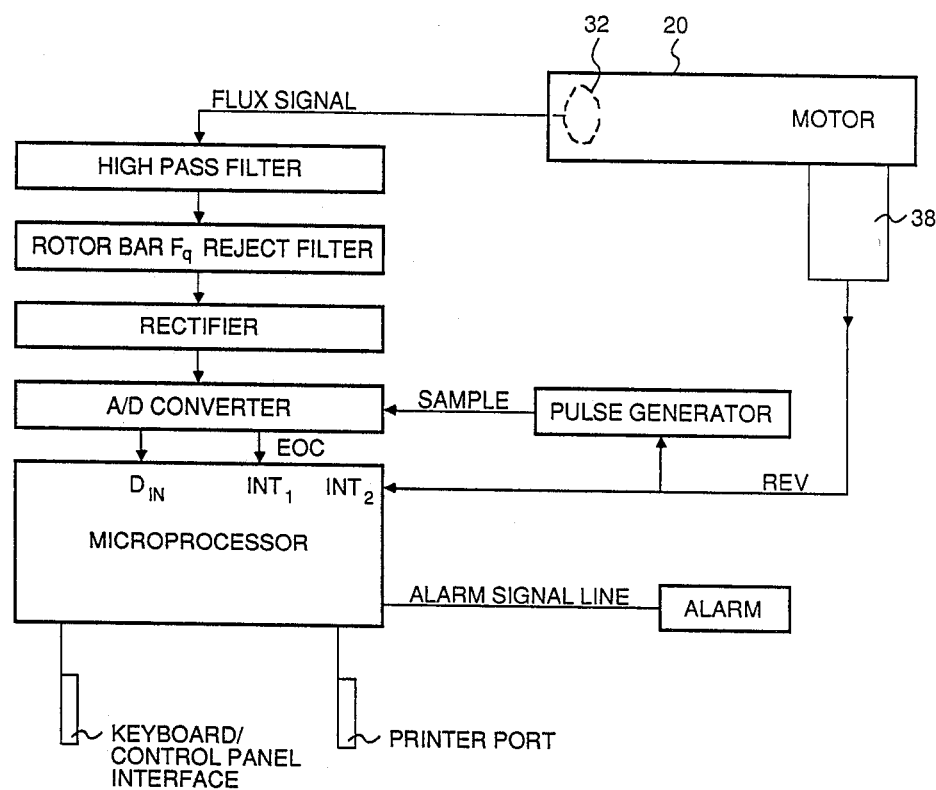
FIG. 7 depicts an embodiment of the invention using analog signal processing components and a microprocessor.

Referring to FIG. 7, in other embodiments, especially in motors in which the invention is incorporated into the motor when it is built, an analog circuit could be coupled to the flux detection coil to reduce the data processing required by the computer 36. As shown in FIG. 7, the analog circuit would preferably include a high pass filter to reject the power supply frequency, a reject filter to reject the rotor bar frequency, and a rectifier to compensate for phase shifts. The output of the analog circuit could be automatically sampled and synchronously time averaged as the data was collected—thereby reducing the data storage requirements of the invention and/or allowing time averaging over a larger period of time. With the memory requirements reduced in this way, the computer portion of the invention could be easily reduced to a dedicated microprocessor incorporated into the motor 20. The microprocessor would be programmed to periodically test the motor, and to sound an alarm when a suspected fault is detected. At such times, a printer could be coupled to the microprocessor so that a plot similar to the ones in FIGS. 5b and 6c could be generated before further investigation of the motor was undertaken. An embodiment of the invention along the lines of the design shown in FIG. 7 could be produced at extremely low cost.

An example of an automated fault detection method using the apparatus in FIG. 7 is shown in Appendix 2.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For instance, as will be understood by those skilled in the art, there are a number of devices which could perform the same signal pick up function as the coil used in the preferred embodiment. Such flux detection devices include hall effect sensors and magnetoresistance sensors.

APPENDIX 1

Synchronous Time Averaging Example for First Embodiment

The filtered data was organized in two arrays:
DATA:  d1  d2  d3  d4 ...  dx1  dx2 ...  dy1 dy2...
REV:    1   0   0   0  ...   1    0  ...   1   0  ...
where each nonzero REV value indicates the beginning of a new data subset. An average was computed by adding corresponding data items using the following algorithm:
i = 1
j = 1
Do Until End Of DATA
    If REV(j) = 1 Then i = 1
    Ave(i) = DATA(j) + Ave(i)
    Increment i and j
End As will be understood by those skilled in the art, it was not necessary to divide the summed data to obtain an "average" because the data is essentially unitless and thus the scaling of the data is arbitrary.

APPENDIX 2

Synchronous Time Averaging Example for Second Embodiment

** Note: data prefiltered by analog circuitry.
Begin execution here once every X hours
    failtest = 0
REPT: i = 1                *** index for rotor position
    loop = 1               *** revolution counter
    maxloop = 91
    setflag = .F.
    Wait Until REV = 0     *** data collection begins
    Wait Until REV = 1     *** at REV up-transition
    Do Until loop = maxloop
        If REV = 0 Then setflag = .T.
        If (REV = 1 .and. setflag)
            i = 1
            loop = loop + 1
            setflag = .F.
        End
        AVE(i) = AVE(i) + datum from flux detector
        i = i + 1
    End                    ** end of loop
    Compute: Mean = average AVE values
             Max = maximum AVE value
             Sigma = standard deviation of AVE values
             Alarm = Max − 3*Sigma − Mean
    If Alarm > 0 Then failtest = failtest + 1
    If failtest = 1 Then GOTO REPT
    If failtest > 1 Then Sound-Suspected-Fault-Alarm

What is claimed is:

1. A method of detecting rotor faults in an induction motor, the motor including a stator and a rotor, the rotor including a multiplicity of rotor bars, the method comprising the steps of:
   generating a flux signal corresponding to the magnetic flux at a predefined flux detection point in the motor which is affected by the flux around each rotor bar in the motor as the rotor revolves;
   generating a synchronization signal once each revolution of the rotor, said synchronization signal occurring when a predefined position on said rotor is closest to said flux detection point;
   filtering said flux signal to reject signals in a predefined frequency band around and including the frequency at which the rotor bars pass said flux detection point; and
   synchronously time averaging the output of said filtering step, using said synchronization signal as the synchronization reference for said averaging;
   whereby statistically significant peaks in the output of said averaging step indicate the presence of a rotor bar fault, and the location of such peaks corresponds to the location of rotor bar faults with respect to said predefined position on said rotor.

2. The method of claim 1, wherein said filtering step further includes rectifying said flux signal before said time averaging step.

3. The method of claim 2, wherein said motor is driven by an a.c. power supply with a characteristic line frequency, and said filtering step further includes filtering said flux signal to reject frequency components of said signal within a predefined spectral band corresponding to said characteristic line frequency.

4. The method of claim 3, wherein said method includes the step of digitally sampling and collecting said flux signal at a rate equal to at least four times the rate at which the rotor bars pass said flux detection point; and
   said filtering step is performed by mathematically filtering said collected flux signal.

5. The method of claim 4, further including the step of
   analyzing the output of said averaging step by searching for at least one statistically significant peak which indicates the presence of a rotor bar fault.

6. The method of claim 2, wherein said method includes the step of digitally sampling and collecting said flux signal at a rate equal to at least four times the rate at which the rotor bars pass said flux detection point; and
   said filtering step is performed by mathematically filtering said collected flux signal.

7. The method of claim 1, further including the step of analyzing the output of said averaging step by searching for at least one statistically significant peak which indicates the presence of a rotor bar fault and, when a rotor bar fault is detected, automatically determining and denoting the location of said fault with respect to said predefined position on said rotor.

8. The method of claim 7, wherein said motor is driven by an a.c. power supply with a characteristic line frequency, and said filtering step further includes filtering said flux signal to reject frequency components of said signal within a predefined spectral band corresponding to said characteristic line frequency.

9. The method of claim 7, wherein said method includes the step of digitally sampling and collecting said flux signal at a rate equal to at least four times the rate at which the rotor bars pass said flux detection point; and
   said filtering step is performed by mathematically filtering said collected flux signal.

10. The method of claim 7, wherein said method includes the steps of rectifying said flux signal before said time averaging step, and digitally sampling and collecting said flux signal at a rate equal to at least four times the rate at which the rotor bars pass said flux detection point; and
    said filtering step is performed by mathematically filtering said collected flux signal.

11. Apparatus for detecting rotor faults in an induction motor, the motor including a stator and a rotor, the rotor including a multiplicity of rotor bars, comprising:
    flux detection means, located at a predefined point on the stator in the motor, for generating a flux signal corresponding to the magnetic flux around each rotor bar in the motor as the rotor revolves;
    tachometer means for generating a synchronization signal once each revolution of the rotor, when a predefined position on said rotor is closest to said flux detection point;
    filter means for filtering said flux signal to reject signals in a predefined frequency band around and including the frequency at which the rotor bars pass said flux detection point; and
    computer means for synchronously time averaging the output of said filter means, using said synchronization signal as the synchronization reference for said averaging, and thereby generating an average flux signal;
    whereby statistically significant peaks in said average flux signal indicate the presence of a rotor bar fault, and the location of such peaks corresponds to the location of rotor bar faults with respect to said predefined position on said rotor.

12. The apparatus of claim 11, wherein said filter means is a computer program which processes said flux signal after it has been stored in said computer means, and includes means for rectifying said flux signal before said time averaging step.

13. The apparatus of claim 12, wherein said motor is driven by an a.c. power supply with a characteristic line frequency, and said filter means further includes means for filtering said flux signal to reject frequency components of said signal within a predefined spectral band corresponding to said characteristic line frequency.

14. The apparatus of claim 12, wherein said apparatus includes
    pulse generator means for generating pulses at a rate equal to at least four times the rate at which the rotor bars pass said predefined point on the motor's stator:
    analog to digital converter means for sampling and converting said flux signal into a digital value each time said pulse generator generates a pulse; and
    said computer means includes memory storage means and software means for storing in said memory storage means a sequence of the digital values generated by said analog to digital converter means.

15. The apparatus of claim 11, further including software means in said computer means for analyzing said average flux signal by searching for at least one statistically significant peak which indicates the presence of a rotor bar fault.

16. The apparatus of claim 11, wherein said apparatus includes analyzing means for analyzing said average flux signal generated by said computer means by searching for at least one statistically significant peak which indicates the presence of a rotor bar fault, including means for automatically determining and denoting the location of said fault with respect to said predefined position on said rotor when a rotor bar fault is detected.

17. Apparatus for detecting rotor faults in an induction motor while the motor is in operation, the motor having a rotor with a multiplicity of rotor bars, comprising:

flux detection means for generating a flux signal corresponding to the magnetic flux around the rotor bars in the motor as the rotor revolves;

tachometer means for generating a synchronization signal once each revolution of the rotor, when the rotor is at a predefined position in the motor;

filter means for filtering said flux signal to reject signals in a predefined frequency band around and including the frequency at which the rotor bars pass a fixed point in the motor, thereby generating a filtered flux signal; and averaging means for synchronously time averaging said filtered flux signal, using said synchronization signal as the synchronization reference for said averaging, thereby generating an average flux signal;

whereby statistically significant peaks in said average flux signal indicate the presence of a rotor bar fault, and the location of such peaks corresponds to the location of rotor bar faults with respect to said predefined position on said rotor.

18. The apparatus of claim 17, further including warning means for performing a predefined fault detection test on said average flux signal and for generating a fault-warning signal when said fault detection test indicates the presence of a rotor bar fault.

19. The apparatus of claim 17, wherein said motor is driven by an a.c. power supply with a characteristic line frequency, and said filter means further includes means for filtering said flux signal to reject frequency components of said signal within a predefined spectral band corresponding to said characteristic line frequency, and rectifier means for rectifying said flux signal.

20. The apparatus of claim 17, wherein said apparatus includes analyzing means for analyzing said average flux signal generated by said averaging means by searching for at least one statistically significant peak which indicates the presence of a rotor bar fault, including means for automatically determining and denoting the location of said fault with respect to said predefined position of said rotor when a rotor bar fault is detected.

21. A method of detecting rotor faults in an induction motor, the motor including a stator and a rotor, the rotor including a multiplicity of rotor bars, the method comprising the steps of:

generating a flux signal while operating said motor to drive a load, said flux signal corresponding to the magnetic flux at a predefined flux detection point in the motor which is affected by the flux around each rotor bar in the motor as the rotor revolves;

generating a synchronization signal once each revolution of the rotor, said synchronization signal occurring when a predefined position on said rotor is closest to said flux detection point;

filtering said flux signal to reject signals in a predefined frequency band around and including the frequency at which the rotor bars pass said flux detection point; and synchronously time averaging the output of said filtering step, using said synchronization signal as the synchronization reference for said averaging;

whereby statistically significant peaks in the output of said averaging step indicate the presence of a rotor bar fault, and the location of such peaks corresponds to the location of rotor bar faults with respect to said predefined position on said rotor.

22. The method of claim 21, further including the step of analyzing the output of said averaging step by searching for at least one statistically significant peak which indicates the presence of a rotor bar fault and, when a rotor bar fault is detected, automatically determining and denoting the location of said fault with respect to said predefined position on said rotor.

23. The method of claim 22, wherein said motor is driven by an a.c. power supply with a characteristic line frequency, and said filtering step further includes filtering said flux signal to reject frequency components of said signal within a predefined spectral band corresponding to said characteristic line frequency; and said method includes the step of rectifying said flux signal before said time averaging step.

* * * * *